(12) United States Patent
Ma et al.

(10) Patent No.: US 6,404,030 B1
(45) Date of Patent: Jun. 11, 2002

(54) CHAIN GATE MOS STRUCTURE

(75) Inventors: Ssu-Pin Ma, Taipei; Shyh-Chyi Wong, Taichung, both of (TW)

(73) Assignee: Taiwan Semiconductor Manufacturing Company, Hisn-Chu (TW)

( * ) Notice: Subject to any disclaimer, the term of this patent is extended or adjusted under 35 U.S.C. 154(b) by 0 days.

(21) Appl. No.: 09/715,213

(22) Filed: Nov. 16, 2000

(51) Int. Cl.$^7$ ................................................ H01L 31/00
(52) U.S. Cl. ...................... 257/459; 257/210; 257/342; 257/401; 257/758; 257/773
(58) Field of Search ................................ 257/459, 401, 257/342, 211, 210, 368, 270, 758, 773, 774

(56) References Cited

U.S. PATENT DOCUMENTS

| | | | | |
|---|---|---|---|---|
| 4,462,041 A | * | 7/1984 | Glenn | 357/23 |
| 5,034,792 A | * | 7/1991 | Kimura et al. | 357/23.14 |
| 5,719,429 A | * | 2/1998 | Yoshida et al. | 257/401 |
| 5,719,806 A | | 2/1998 | Yamane et al. | 365/185.16 |
| 5,789,791 A | | 8/1998 | Bergemont | 257/401 |
| 5,828,102 A | | 10/1998 | Bergemont | 257/342 |
| 5,831,316 A | * | 11/1998 | Yu et al. | 257/401 |
| 5,990,504 A | | 11/1999 | Morifuji | 257/270 |
| 6,023,086 A | | 2/2000 | Reyes et al. | 257/341 |
| 6,140,687 A | * | 10/2000 | Shimomura et al. | 257/401 |

FOREIGN PATENT DOCUMENTS

| | | | |
|---|---|---|---|
| JP | 03142844 A | * | 6/1991 |
| JP | 2000156494 A | * | 6/2000 |

* cited by examiner

*Primary Examiner*—Nathan Flynn
*Assistant Examiner*—Remmon R. Fordé
(74) *Attorney, Agent, or Firm*—George O. Saile; Stephen B. Ackerman

(57) ABSTRACT

A structure is disclosed for a multi-finger transistor with improved high frequency performance. An array of isolated active regions is formed in a semiconductor substrate. A source region and a drain region are formed in each of the active regions and are disposed on either side of a central channel region. A gate oxide layer is formed over each channel region. Conductive gate fingers that extend over the gate oxide layers and also beyond the active areas are formed so that each gate finger constitutes a continuous conductive line providing and connecting the gates of the plurality of active regions. A dielectric layer is formed over the active regions and over the surrounding isolation regions. A conductive via is formed through the dielectric layer to each source region and to each drain region. For each gate finger or conductive via is opened between the active region and at both ends of the finger contact region is formed over each conductive via. Conductive lines are formed connecting together all the contact regions disposed over source regions, connecting together all the contact regions disposed over drain regions and connecting together all the contact regions disposed over gate fingers.

22 Claims, 4 Drawing Sheets

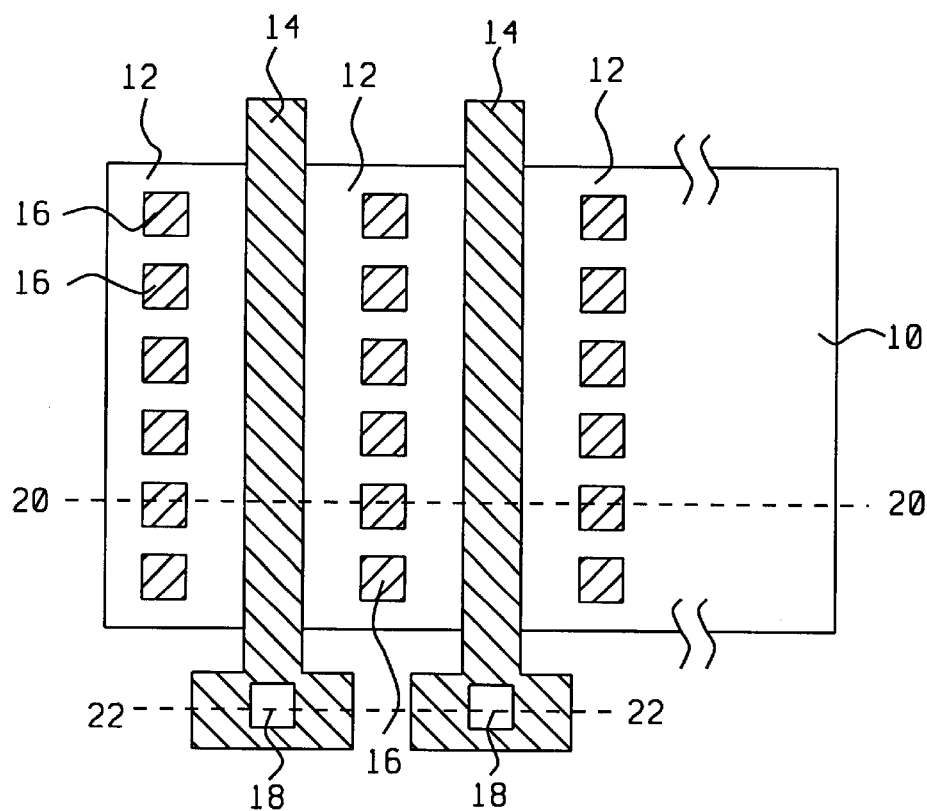
FIG. 1 – Prior Art
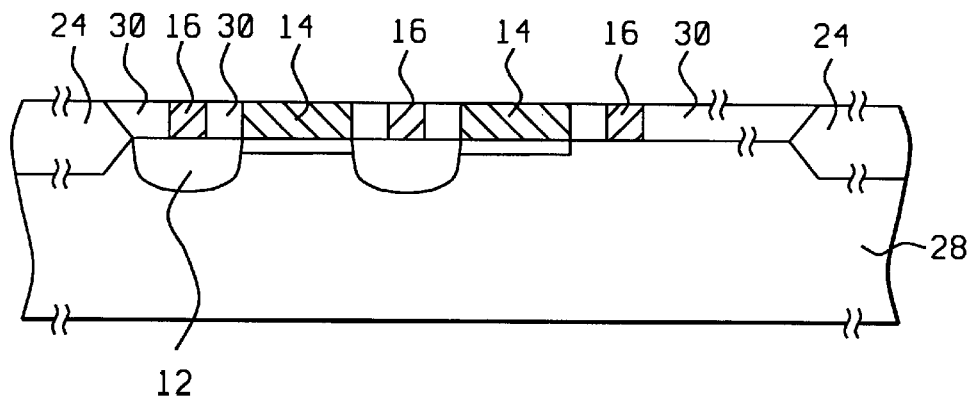
FIG. 2 – Prior Art

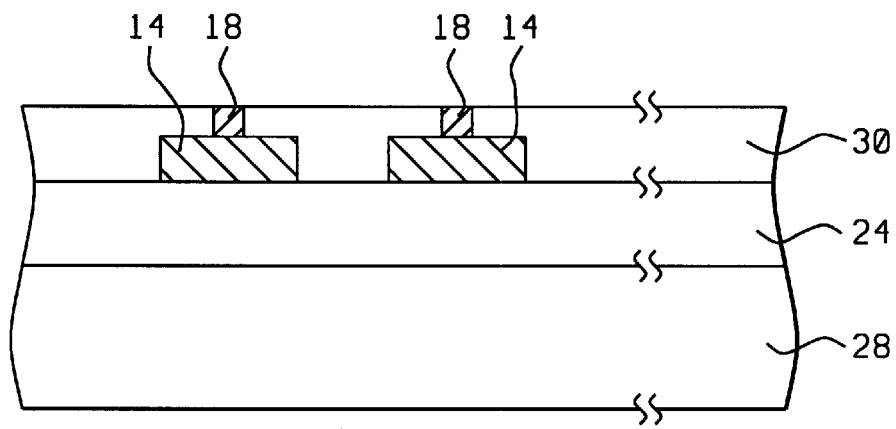
FIG. 3 - Prior Art
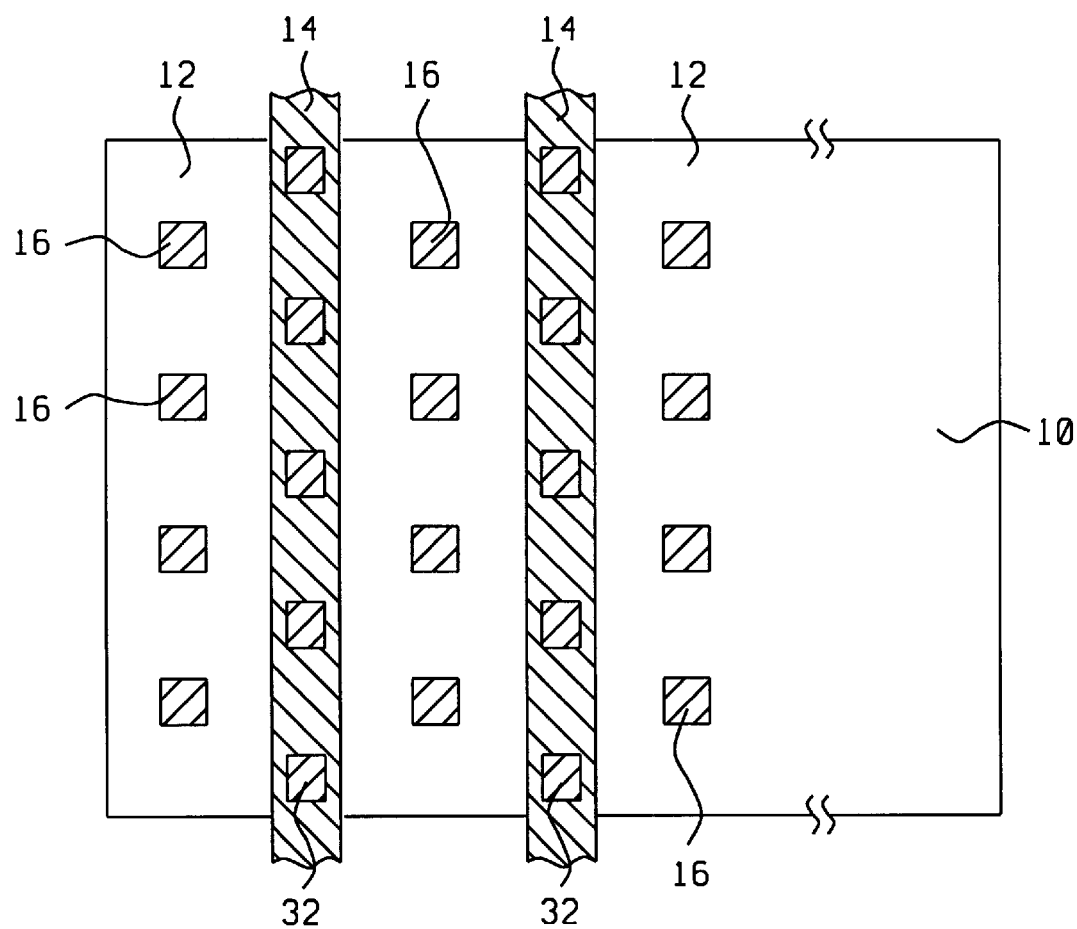
FIG. 4

CHAIN GATE MOS STRUCTURE

BACKGROUND OF THE INVENTION (1). Field of the Invention

The present invention relates to semiconductor devices, and more particularly to multi-finger MOSFET structures suitable for high frequency operation.

(2). Description of Prior Art

Multi-finger MOSFET structures are conventionally used in high frequency applications, rather than a single gate, because the reduced resistances of multi-finger MOSFETs gives rise to improved high frequency performance. In addition, for the short channel lengths and large gate widths of modem MOSFETs, a single gate would be extensive in one dimension, posing a layout problem. This problem is alleviated in a multi-finger late since the gate width is distributed among the fingers. When the finger length is a significant fraction of the gate width, there will be moderate number of fingers, and the device will be essentially two-dimensional. However, for conventional multi-finger gate structures longer fingers are more resistive. Thus, for conventional multi-finger structures the high frequency performance requirement, which favors short fingers, is opposed to the efficient layout requirement, which favors longer fingers.

A conventional multi-finger MOSFET, covering an active region, 10, which is surrounded by field oxide, is shown in FIG. 1 PRIOR ART. Source/drain regions, 12, are parallel to and disposed on opposite sides of channel regions, which are separated by gate oxide layers from polysilicon gate fingers, 14, directly above. The cross sections 20 and 22 depicted in FIGS. 2 and 3 PRIOR ART further illustrate the structure. For the sake of clarity only a few source/drain regions and polysilicon gate finger regions are explicitly shown in the active region. However it should be understood that the active region is completely covered by these regions. In the active region, defined by the surrounding field oxide, 24, the surface of the underlying semiconductor substrate, 28, contains parallel source/drain regions, 12 and gate oxide regions, 26. Contacts to the source/drain regions, 12, are made by vias, 16, through a dielectric layer, 30. Contacts to the polysilicon fingers are made over the field oxide, 24, outside of the active region by vias 18. When contact is made to the gate fingers at the edge of the active region so that the edges of the gate fingers are essentially shorted together, and similarly for the source regions and the drain regions, there results a significant reduction in resistance. This is because the resistive length has been reduced by a factor equal to the inverse of the number of fingers. When contacts, 16, which connect to the source/drain regions through vias, 16, in a dielectric layer, 30 are added further decreases in resistance can result. By shorting the contacts to the source regions together and shorting the contacts to the drain regions together the resistive paths in these regions are reduced leading to a lower resistance.

In U.S. Pat. No. 5,789,791, Bergemont discloses multi-finger MOS transistor structures with reduced gate resistance. Shorting together the ends of each of the gates reduces the gate resistance and this is accomplished in a variety of ways. Multiple contacts are used to the source and drain regions. A method to completely short the gate area is disclosed in U.S. Pat. No. 5,828,102 to Bergemont, which does not include contacts to the source and drain regions within the active area. U.S. Pat. No. 6,023,086 to Reyes et al, teaches a multi-finger MOS transistor with a stabilizing gate electrode and U.S. Pat. No. 5,990,504 to Morifuji et al. teaches a multi-finger MOSFET with reduced noise. A memory cell array is disclosed in U.S. Pat. No. 5,719,806 to Yamane et al.

SUMMARY OF THE INVENTION

As a consequence, it is a major objective of the invention to provide multi-finger MOSFET structures with improved high frequency performance, but that do not require a short finger length. In one embodiment, referred to as the "on gate" configuration, the configuration is essentially that of FIG. 1 PRIOR ART with multiple contacts added to each gate finder. These added gate contacts are situated between source and drain contacts in a manner so that source and drain contacts are not beside gate contacts. Additional gate contacts reduce the gate resistance and thus improve the high frequency performance. Furthermore, by adding contacts, high frequency performance can be maintained even as the finger length is increased. In a preferred embodiment, referred to as the "gate chain" configuration, a series of isolated active areas are perpendicular to each polysilicon gate finger. Contacts to the polysilicon gates are made external to and on both sides of the active areas. In each active area a channel region is disposed under the polysilicon gate, a source region is disposed to one side of the polysilicon gate and a drain region is disposed to the other side. Contacts are made to each source and drain region. In the embodiments, the gate contacts are connected together by low resistance lines, the source contacts are similarly connected, as are the drain contacts.

Measurements were performed of three indicators of high frequency performance, the noise figure, Nfmin, the effective resistance, Rn, and the maximum frequency, fmax; for transistors with the gate chain configuration, the on gate configuration and with the configuration of FIG. 1 PRIOR ART, denoted the normal configuration. With respect to Nfmin, the gate chain configuration is best and the on gate configuration is superior to the normal configuration. With respect to Rn, the on gate configuration is best and the chain gate and normal configurations are similar. With respect to fmax, the gate chain configuration is the best and the on gate configuration is superior to the normal configuration. Significant improvements are seen to accrue from the gate chain and on gate embodiments of the invention.

A structure is disclosed for a multi-finger transistor with improved high frequency performance. An array of isolated active regions is formed in a semiconductor substrate. A source region and a drain region are formed in each of the active regions and are disposed on either side of a central channel region. A gate oxide layer is formed over each channel region. Conductive gate fingers that extend over the gate oxide layers and also beyond the active areas are formed so that each gate finger constitutes a continuous conductive line providing and connecting the gates of a plurality of active regions. A dielectric layer is formed over the active regions and over the surrounding isolation regions. A conductive via is formed through the dielectric layer to each source region and to each drain region. For each gate finger a conductive via is opened between the active regions and at both ends of the finger. A contact region is formed over each conductive via. Conductive lines are formed connecting together all the contact regions disposed over source regions, connecting together all the contact regions disposed over drain regions and connecting together all the contact regions disposed over gate fingers.

BRIEF DESCRIPTION OF THE DRAWINGS

In the accompanying drawings, forming a material part of this description there is shown:

FIGS. 1–3 PRIOR ART show a conventional multi-finger MOSFET.

FIG. 4 shows a multi-finger MOSFET according to the on gate embodiment of the invention.

DESCRIPTION OF THE PREFERRED EMBODIMENTS

Referring to FIG. 4, there is shown a multi-finger MOSFET according to an embodiment of the invention having an on gate configuration. An active region, 10, is surrounded by an isolation region, which can be conventionally formed field oxide. Source/drain regions, 12 are implanted in a semiconductor substrate, using techniques known to those skilled in the art, and are parallel to and disposed on both sides of polysilicon gate fingers, 14. Gate oxide layers separate the polysilicon gate fingers from the underlying semiconductor substrate. The gate oxide layers and polysilicon gate fingers are conventionally formed using methods known to those skilled in the art. For the sake of clarity only a few source/drain regions and polysilicon gate finger regions are explicitly shown in the active region. However it should be understood that the active region is completely covered by these regions. A dielectric layer, 30, is than formed overall, which typically is deposited by techniques such as LPCVD using TEOS or APCVD using TEOS, ozone and silicon dioxide. Vias, 16, are then opened to, the source/drain regions and, at the same time, vias, 32, are opened to the polysilicon gate fingers. The vias provide for a multiplicity of electrical contacts to the respective regions. Methods for forming vias and contacts are well known to those skilled in the art. As is the case for conventional multi-finger MOSFET, low resistance lines will connect together the vias to the source regions, the vias to the drain regions and the vias to the polysilicon gate fingers. By shorting the contacts to the source regions together, shorting the contacts to the drain regions together and shorting the contacts to the polysilicon gate fingers together, the resistive paths in these regions are reduced leading to a lower resistance. A lower resistance results in the on gate configuration than in the conventional configuration as a consequence of the added contacts to the polysilicon gate fingers.

Figure 5:
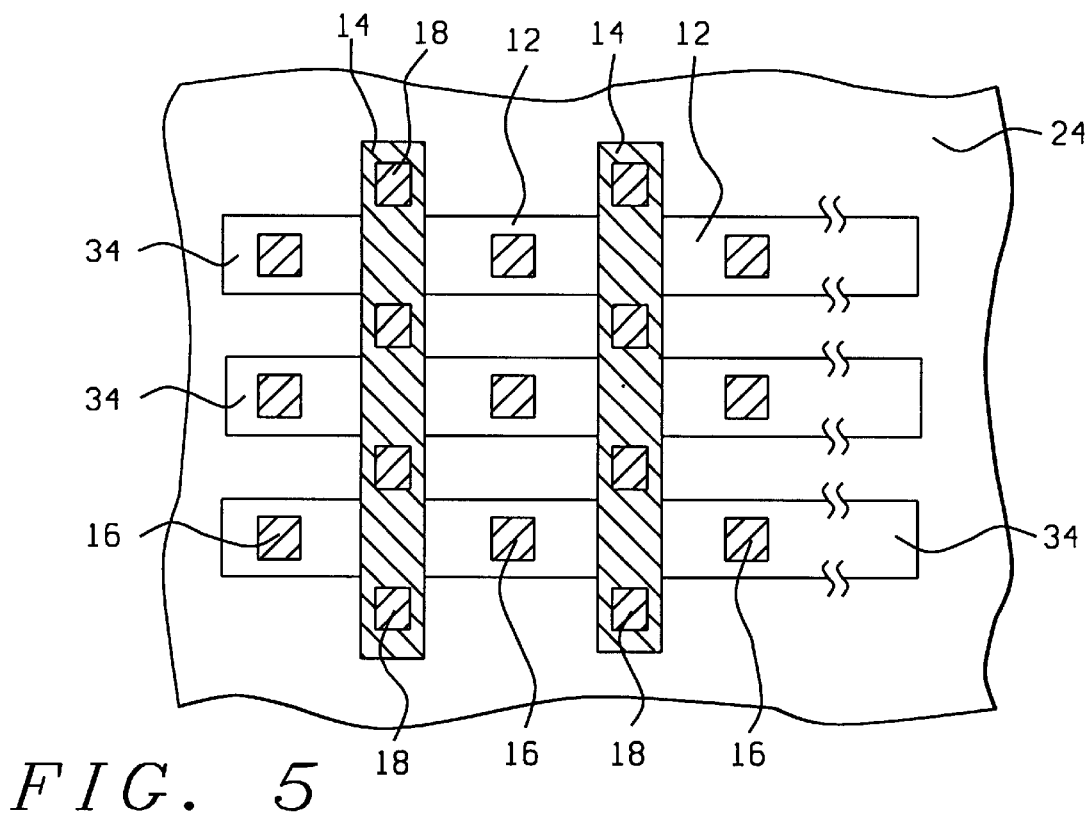
FIG. 5 shows a multi-finger MOSFET according to the gate chain embodiment of the invention.
Figure 6:
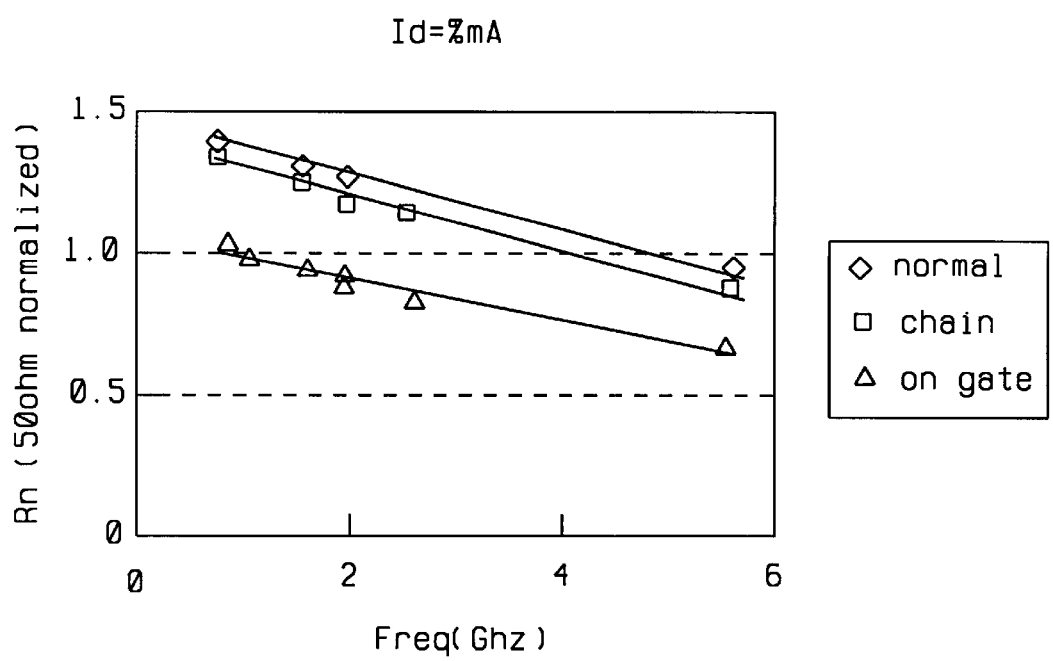
FIG. 6 shows Rn vs. frequency for the gate chain and on gate configurations of the invention and also for a conventional configuration.
Figure 7:
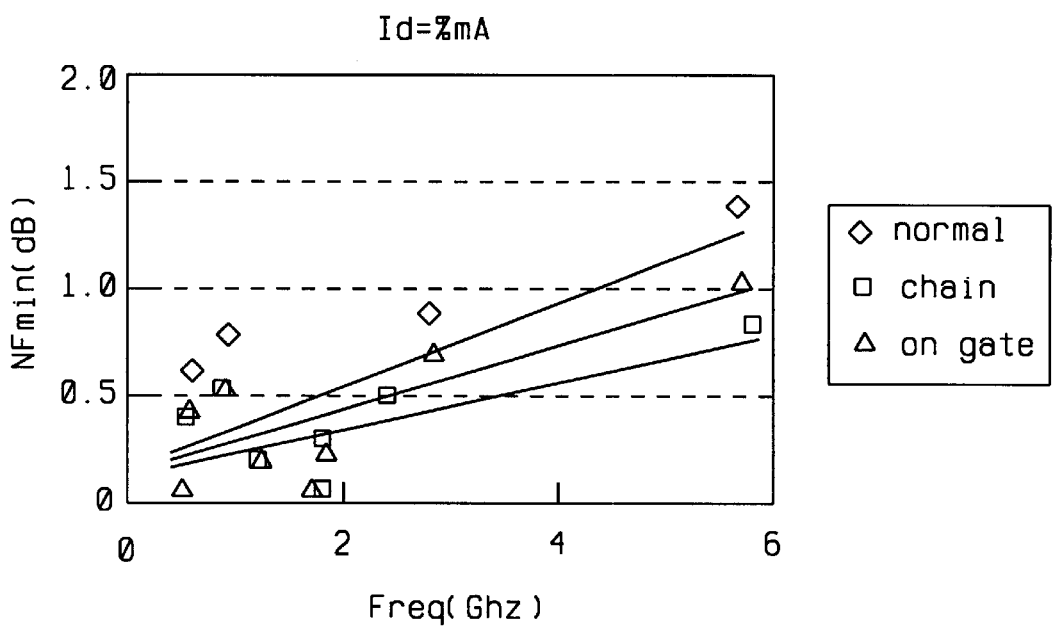
FIG. 7 shows NFmin vs. frequency for the gate chain and on gate configurations of the invention and also for a conventional configuration.
Figure 8:
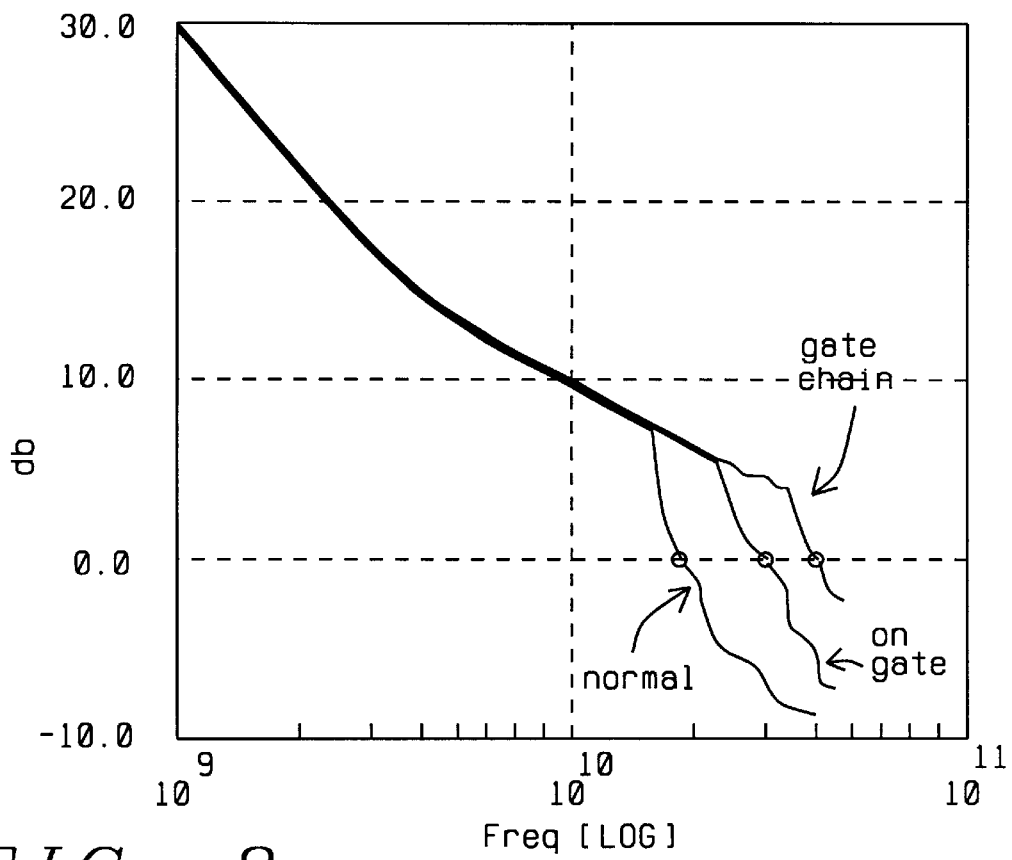
FIG. 8 shows fmax and how it is obtained for the gate chain and on gate configurations of the invention and also for a conventional configuration.

Referring to FIG. 5, there is shown a multi-finger MOSFET according to an embodiment of the invention having a gate chain configuration. Active regions, 34, are surrounded by isolation regions, 24, which can be conventionally formed field oxide. Source/drain regions, 12, are implanted in the semiconductor substrate, using techniques known to those skilled in the art, in each of the active regions. The source/drain regions are parallel to and disposed on opposite sides of a polysilicon gate finger, 14. Gate oxide layers separate the polysilicon gate fingers from the underlying semiconductor substrate. The gate oxide layers and polysilicon gate fingers are conventionally formed using methods known to those skilled in the art. There is a multiplicity of active regions for each polysilicon gate finger. A dielectric layer is than formed overall, which typically is deposited by techniques such as LPCVD using TEOS or APCVD using TEOS, ozone and silicon dioxide. Vias, 16, are then opened to the source/drain regions of each active region and vias, 18, are opened to the polysilicon gate fingers over the field oxide at each end and between each active region. The vias provide electrical contact to the source/drain regions and to the polysilicon gate fingers. Methods for forming vias and contacts are well known to those skilled in the art. As is the case for conventional multi-finger MOSFET, low resistance lines will connect together vias to the source regions, vias to the contact region and vias to the polysilicon gate fingers. The resistive paths in these regions are thus reduced leading to a lower resistance. However, by using distinct active regions the total active region for the chain gate configuration is reduced compared to the conventional configuration and also as compared to the on gate configuration of the invention. As shown in FIG. 6, the resistance of the gate chain configuration is found to be just slightly lower than that of the normal configuration, which is the conventional configuration depicted in FIG. 1, and higher than that of the on gate configuration. Nevertheless, the data of FIGS. 7 and 8 clearly indicate that the gate chain configuration provides the best high frequency performance, followed by the on gate configuration that is superior to the normal configuration. FIG. 7 shows the noise figure, Nfmin, as a function of frequency. Data for the gate chain configuration consistently falls below, that for the other configurations, which is best, and the data for the on gate configuration is below that for the normal configuration. FIG. 8 presents results on the gain verses frequency for the three configurations. An important figure of merit, indicating high frequency performance is the frequency fmax, which is the frequency for which the gain is equal to one. A high finax is preferable. By this measure the gate chain configuration is again best, and again the on gate configuration is superior to the normal configuration.

While the invention has been particularly shown and described with reference to the preferred embodiments thereof, it will be understood by those skilled in the art that various changes in form and detail may be made without departing from the spirit and scope of the invention.

What is claimed is:

1. A multi-finger transistor formed in a semiconductor substrate, comprising:
   an array of active regions surrounded by isolation regions;
   a source region and a drain region formed in each of said active regions and disposed on either side of a central channel region;
   a gate oxide layer formed over each channel region;
   conductive gate fingers that extend over the gate oxide layers and also beyond the active areas, formed so that each gate finger constitutes a continuous conductive line providing and connecting the gates of a plurality of active regions;
   a dielectric layer formed over the active regions and over the surrounding isolation regions;
   a conductive via through the dielectric layer to each source region; a
   a conductive via through the dielectric layer to each drain region; for
   for each gate finger, a conductive via through the dielectric layer to the gate finger between each active region and at both ends of the finger;
   a contact region over each conductive via;
   conductive lines connecting together all the contact regions disposed over source regions;
   conductive lines connecting together all the contact regions disposed over drain legions, conductive lines connecting together all the contact regions disposed over gate fingers.

2. The multi-finger transistor of claim 1 wherein said semiconductor substrate is a silicon substrate.

3. The multi-finger transistor of claim 1 wherein the active regions are initially comprised of an n-type semiconductor and the source and drain regions are formed be implantation of acceptor ions.

4. The multi-finger transistor of claim 1 wherein the active regions are initially comprised of an p-type semiconductor and the source and drain regions are formed by implantation of donor ions.

5. The multi-finger transistor of claim 1 wherein the isolation of the active regions is provided by field oxide.

6. The multi-finger transistor of claim 1 wherein the gate oxide layer silicon dioxide.

7. The multi-finger transistor of claim 1 wherein the conductive gate fingers are polysilicon.

8. The multi-finger transistor of claim 1 wherein the conductive gate fingers are a double layer, a layer of polysilicon under a layer of refractory metal silicide.

9. The multi-finger transistor of claim 1 wherein the dielectric layer is oxide deposited using LPCVD using TEOS or APCVD using TEOS, ozone and silicon dioxide.

10. The multi-finger transistor of claim 1 wherein the conductive lines are layers of metal or metal silicide.

11. The multi-finger transistor of claim 1 wherein the conductive lines are aluminum or aluminum in combination with refractory metals or refractory metal silicides.

12. A multi-finger transistor formed in a semiconductor substrate, comprising:

an active region surrounded by isolation regions;

parallel source regions, drain regions and channel regions formed in said active region and where each channel region has a source region on one side and a drain region on the other side;

a gate oxide layer formed over each channel region;

conductive gate fingers that extend over the gate oxide layers and also beyond the active areas;

a dielectric layer formed over the active region and over the surrounding isolation region;

a plurality of conductive vias through the dielectric layer to each source region;

a plurality of conductive vias through the dielectric layer to each drain region;

a plurality of conductive vias through the dielectric layer to each gate finger;

a contact region over each conductive via wherein the source contact regions face the drain contact regions across the channel regions and the conductive gate finger contact regions are disposed between every two pairs .of source and drain contact regions and also at the end of each conductive gate finger;

conductive lines connecting together all the contact regions disposed over source regions;

conductive lines connecting together all the contact regions disposed over drain regions;

conductive lines connecting together all the contact regions disposed over gate fingers.

13. The multi-finger transistor of claim 12 wherein said semiconductor substrate is a silicon substrate.

14. The multi-finger transistor of claim 12 wherein the active regions initially comprised of an n-type semiconductor and the source and drain regions are formed by implantation of acceptor ions.

15. The multi-finger transistor of claim 12 wherein the active region is initially comprised of an p-type semiconductor and the source and drain actions are formed by implantation of donor ions.

16. The multi-finger transistor of claim 12 wherein the isolation of the active region is provided by field oxide.

17. The multi-finger transistor of claim 12 wherein the gate oxide layer is silicon dioxide.

18. The multi-finger transistor of claim 12 wherein the conductive gate fingers are polysilicon.

19. The multi-finger transistor of claim 12 wherein the conductive gate fingers are a double layer comprised of a layer of polysilicon under a layer of refractory metal silicide.

20. The multi-finger transistor of claim 12 wherein the dielectric fay r is oxide deposited using LPCVD using TEOS or APCVD using TEOS, ozone and silicon dioxide.

21. The multi-finger transistor of claim 12 wherein the conductive lines are layers of metal or metal silicide.

22. The multi-finger transistor of claim 12 wherein the conductive lines are aluminum or aluminum in combination with refractory metals or refractory metal suicides.

* * * * *